United States Patent
Guerin et al.

(10) Patent No.: US 12,046,690 B2
(45) Date of Patent: Jul. 23, 2024

(54) PHOTOVOLTAIC MODULE WITH INTEGRATED PRINTED BYPASS DIODE

(71) Applicant: COMMISSARIAT A L'ENERGIE ATOMIQUE ET AUX ENERGIES ALTERNATIVES, Paris (FR)

(72) Inventors: Thomas Guerin, Grenoble (FR); Romain Cariou, Grenoble (FR); Sébastien Noel, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/079,465

(22) Filed: Dec. 12, 2022

(65) Prior Publication Data
US 2023/0187568 A1    Jun. 15, 2023

(30) Foreign Application Priority Data

Dec. 10, 2021   (FR) ...................................... 2113297

(51) Int. Cl.
*H01L 31/0443*   (2014.01)
*H01L 31/0475*   (2014.01)
(Continued)

(52) U.S. Cl.
CPC ...... *H01L 31/0443* (2014.12); *H01L 31/0475* (2014.12); *H01L 31/0504* (2013.01); *H01L 31/1844* (2013.01)

(58) Field of Classification Search
CPC ............. H01L 31/0443; H01L 31/0475; H01L 31/048; H01L 31/0504
See application file for complete search history.

(56) References Cited

U.S. PATENT DOCUMENTS

2004/0159102 A1*   8/2004   Toyomura ......... H01L 31/02021
                                                     257/E27.123
2005/0072457 A1    4/2005   Glenn
(Continued)

FOREIGN PATENT DOCUMENTS

EP          3147952 B1      11/2018
KR   10-2013-0139493 A     12/2013
(Continued)

OTHER PUBLICATIONS

Aug. 1, 2022 Search Report issued in French Patent Application No. 2113297.

*Primary Examiner* — Golam Mowla
(74) *Attorney, Agent, or Firm* — Oliff PLC

(57) ABSTRACT

A photovoltaic module, having: a substrate, a plurality of photovoltaic structures that are electrically connected to one another and extend over the substrate, each of which comprises at least one photovoltaic cell, and a multilayer electrical connection structure sandwiched between the substrate and the plurality of photovoltaic structures, forming at least one bypass diode for each photovoltaic structure, each bypass diode having: two electrodes electrically connected to the terminals of opposite polarity of the corresponding photovoltaic structure, at least one of the two electrodes extending at least partially underneath the corresponding photovoltaic structure, and a semiconductor portion in contact with the two electrodes via two separate surfaces.

17 Claims, 6 Drawing Sheets

(51) Int. Cl.
*H01L 31/05* (2014.01)
*H01L 31/18* (2006.01)

(56) References Cited

U.S. PATENT DOCUMENTS

| | | |
|---|---|---|
| 2008/0149173 A1 | 6/2008 | Sharps |
| 2009/0025778 A1 | 1/2009 | Rubin et al. |
| 2009/0114261 A1* | 5/2009 | Stancel ............. H01L 31/02013 |
| | | 136/244 |

FOREIGN PATENT DOCUMENTS

| | | |
|---|---|---|
| KR | 10-1349847 B1 | 1/2014 |
| WO | 2021/123575 A1 | 6/2021 |

* cited by examiner

PHOTOVOLTAIC MODULE WITH INTEGRATED PRINTED BYPASS DIODE

The present invention relates to a photovoltaic module having an integrated printed bypass diode and to a method for manufacturing it. The invention also deals with the use of such a photovoltaic module.

TECHNICAL FIELD

A photovoltaic module is made up of a succession of photovoltaic cells that are electrically connected to one another and encapsulated in a stack of materials of glass and/or polymer type. The cells are traditionally connected by a metal part, generally wires or strips. The photovoltaic cells are conventionally protected in groups by added bypass diodes (as they are conventionally known) that ensure current can pass through in the event of breakage or shading of one or more cells in a group, and thus limit the power losses. Traditionally, such diodes are offset and kept away from the main electrical circuit, thereby decreasing the surface area to the detriment of the photovoltaic cells.

It is likewise known practice to individually protect each photovoltaic cell using an added bypass diode. In this case, the bypass diodes are traditionally close to the photovoltaic cells in question, for example to the side, notably in the field of space where they can be integrated in a corner cut off from the photovoltaic cell, or underneath it, notably in the field of stratospheric modules. It is likewise known practice to integrate them in a multilayer structure. In this regard, it is possible to cite patent application US20050072457, which describes a module having, from bottom to top, a substrate 24, a highly thermally conductive multilayer structure 40, and photovoltaic structures each having an intermediate structure on which a photovoltaic cell is arranged. The intermediate structures have an off-the-shelf prefabricated bypass diode made of silicon that has a small extent and extends between the cells and the substrate. Patent application US 20090025778 describes a photovoltaic device having a bypass diode extending between the cells and the substrate, electrodes, and joining bars connecting the cells to the bypass diode and also deals with an added bypass diode.

It is likewise known practice to have photovoltaic modules including a printed electrical structure underneath the photovoltaic cells, having, underneath each photovoltaic cell, a printed electrode electrically connected to the photovoltaic cell, the photovoltaic cells being connected to one another by interconnections between each cell and the electrode electrically connected to the cell downstream.

Patent applications KR 10 2013 01349847 and KR 10 2013 0139493 describe photovoltaic cells made up of vertical structures having, superimposed from bottom to top, a substrate having two electrodes separated by an insulator, a bypass diode and a photovoltaic cell. The assembly formed by the bypass diode and the photovoltaic cell is superimposed on one of the electrodes of the substrate. The electrodes of the substrate are electrically connected to the diode and to the cell by electric wires or conductive tracks, via additional connection electrodes. The substrate, the diode and the cell are manufactured separately and joined via junction layers.

Patent application US 2008/0149173 discloses a semiconductor structure having, superimposed on one another, a substrate, an electrode, multiple photovoltaic cells in series, and a bypass diode, the superimposition being formed by depositing successive layers. The bypass diode is an electrical bypass of the photovoltaic cells connected to one another in series.

The international application WO2021123575 discloses a satellite solar generator having multiple photovoltaic modules mounted on a flexible substrate. The modules have a printed circuit having an insulating substrate and conductive tracks on one face of the support, and chains of photovoltaic cells in series that are mounted on the face bearing the tracks and are connected to the tracks so as to establish an electrical connection between the chains. Such a generator may have one blocking diode per module.

Patent application EP 3 147 952 describes a solar generator having a flexible substrate bearing a network of solar cells formed in various transverse lines of cells mounted in series and independent electrical transfer conductors for each transverse line. The generator likewise comprises one blocking diode on each line at the proximal end of the solar generator that is mounted spaced apart from the cells. The electrical conductors may be formed by conductive tracks etched into a monolayer or multilayer flexible printed circuit. The electrical conductors may be sandwiched between two insulator layers in the printed circuit.

There is a need to benefit from a photovoltaic module which at the same time has good efficiency, has a small thickness, is easy to implement, and has electrical protection for individual photovoltaic cells or for each group of photovoltaic cells in the event of breakage or shading of one or more cells.

SUMMARY OF THE INVENTION

The invention meets this need with the aid of a photovoltaic module, having:
  a substrate,
  a plurality of photovoltaic structures that are electrically connected to one another and extend over the substrate, each of which comprises at least one photovoltaic cell, and
  a multilayer electrical connection structure sandwiched between the substrate and the plurality of photovoltaic structures, forming at least one bypass diode for each photovoltaic structure,
  each bypass diode having:
  two electrodes electrically connected to the terminals of opposite polarity of the corresponding photovoltaic structure, at least one of the two electrodes extending at least partially underneath the corresponding photovoltaic structure, and
  a semiconductor portion in contact with the two electrodes via two separate surfaces.

"Terminals of opposite polarity" is understood to mean an end cathode and anode of the photovoltaic structure.

"Bypass diode" is understood as another term for a diode that makes it possible to protect the photovoltaic structure from overheating, notably caused by the malfunctioning or shading of one or more cells of the photovoltaic structure. Such a bypass diode is, by definition, connected in parallel with the photovoltaic structure, but with an opposite polarity to the photovoltaic structure. During normal operation, the photovoltaic structure will be in the on state and the bypass diode will be reverse biased so as to stop the flow of current. However, when the photovoltaic structure is reverse biased owing to insufficient short-circuit current between multiple cells connected in series (notably shading of one or more cells), then the bypass diode is in the on state.

Integrating the bypass diode(s) between the photovoltaic structures and the substrate makes it possible to save on useful space on the surface of the module for the photovoltaic structures. This makes it possible to collect more power per unit area (W/m$^2$).

The presence of the bypass diode(s) in the multilayer electrical connection structure can make it possible to do away with an insulator in the latter owing to the insulation afforded by the semiconductor portion.

In the present module, since the bypass diode(s) are internal to the module, it (they) is (are) protected with respect to the environment, thereby making it possible notably to use organic-type bypass diodes.

Such a module makes it possible to limit the number of welds or the integration of added elements in the module, thereby reducing the number of required manufacturing steps and thus facilitating its manufacture.

Substrate

The substrate may be flexible or rigid.

The substrate may be made of a polymer material, notably polyimide (Kapton) or polyetheretherketone (PEEK).

The substrate may have a thickness of between 25 µm and 8 cm, better still between 25 µm and 1 cm, even better still between 25 µm and 200 µm, notably for a flexible substrate.

The substrate preferably has a surface, notably flat surface, over which the multilayer electrical connection structure extends.

The substrate is preferably an electrically insulating material.

Photovoltaic Structure

At least one photovoltaic structure may comprise a single photovoltaic cell. The bypass diodes then make it possible to protect each cell individually.

At least one photovoltaic structure may comprise an assembly of multiple photovoltaic cells in series, the one of the two electrodes of the corresponding bypass diode being electrically connected to the first photovoltaic cell of the assembly in series, the other one of the two electrodes of the corresponding bypass diode being electrically connected to at least the last photovoltaic cell of the assembly in series. The bypass diode associated with the photovoltaic structure then makes it possible to protect the series of cells when one of them is reverse biased.

The photovoltaic structures may all comprise the same number of photovoltaic cells.

The photovoltaic structures may all be identical. As a variant, at least two photovoltaic structures are different, notably comprise a different number of photovoltaic cells or photovoltaic cells having different characteristics.

The photovoltaic cell(s) of each photovoltaic structure are preferably III-V type multi junction cells with semiconductor materials, notably GaInP/GaAs/Ge triple-junction photovoltaic cells. As a variant, the photovoltaic cells are single-junction cells, notably made of thin-film CIGS, of silicon, of cadmium telluride (CdTe), or perovskite.

The photovoltaic structures preferably all have the same thickness.

The thickness of the photovoltaic structures, notably of the photovoltaic cells, may be greater than or equal to 10 µm. The thickness of the photovoltaic structures, notably of the photovoltaic cell(s), may be less than or equal to 200 µm.

Multilayer Electrical Connection Structure

The multilayer electrical connection structure preferably extends directly over the substrate.

The multilayer electrical connection structure may be printed or otherwise deposited on the substrate, notably is formed by printing, cathodic sputtering, pulsed laser deposition, chemical vapour deposition (CVD) or (PECVD) or else atomic layer deposition (ALD).

The multilayer electrical connection structure preferably has a substantially uniform thickness over the substrate.

The two electrodes of the bypass diodes may be made of a conductive metal, for example aluminium, copper, molybdenum, silver or gold, or a conductive oxide, notably indium tin oxide (ITO) or aluminium-doped zinc oxide (AZO), or an organic semiconductor, notably made of poly(3,4-ethylenedioxythiophene) (PEDOT) or poly(triarylamine) (PTAA).

The two electrodes of the bypass diodes are preferably made of one and the same material. As a variant, one of the two electrodes of the bypass diodes is made of a first conductive material notably selected from aluminium, copper, molybdenum, silver or gold, or a conductive oxide, notably indium tin oxide (ITO) or aluminium-doped zinc oxide (AZO), and the other one of the two electrodes of the bypass diodes is made of a second conductive material different from the first conductive material, notably is made of gold or an organic semiconductor, such as poly(3,4-ethylenedioxythiophene) (PEDOT) or poly(triarylamine) (PTAA).

The two electrodes of the bypass diodes may each have a thickness of between 0.1 um and 100 µm, better still between 0.2 µm and 15 µm, at the bypass diode.

The semiconductor portions of the bypass diodes may comprise an organic semiconductor or metal oxide, notably intrinsic zinc oxide (ZnO:I), titanium oxide (TiO$_2$), zirconium oxide (ZrO$_2$), tin dioxide (SnO$_2$) or else amorphous germanium (a-Ge) or amorphous silicon (a-Si).

The semiconductor portions may each have a thickness of between 0.1 µm and 100 µm, better still between 0.1 µm and 5 µm.

The bypass diodes may have a total thickness of between 0.3 µm and 500 µm, better still between 0.5 µm and 50 µm.

The semiconductor portions are preferably each sandwiched between the two electrodes of the same bypass diode so as to form a stack. The semiconductor portions may each be in contact with one of the electrodes via a first surface substantially parallel to a plane of extent of the photovoltaic structures, and in contact with the other one of the electrodes via a second surface opposite to the first. The stacks may each extend along a surface area parallel to the plane of the photovoltaic structures that is greater than or equal to 50%, better still greater than or equal to 80%, even better still greater than or equal to 90%, of the surface area of the photovoltaic structure. Such an extent makes it possible to have a bypass diode with a large surface area, thereby facilitating the heat dissipation of the bypass diode during operation.

As a variant, in each bypass diode, the semiconductor portion is juxtaposed with the two electrodes. The semiconductor portions may each be in contact with one of the electrodes via a first surface, notably substantially perpendicular to the plane of extent of the photovoltaic structures, and in contact with the other one of the electrodes via a second surface opposite to the first.

The two electrodes of each bypass diode may be separated from one another solely by the semiconductor portion of the corresponding bypass diode. As a variant, the bypass diodes may each comprise at least one insulating portion designed to separate the two electrodes from one another by way of the semiconductor portion.

The semiconductor portions preferably each comprise at least one thickened zone for separating the two electrodes of the corresponding bypass diode from one another at the substrate and/or at the surface of the multilayer electrical connection structure bearing the photovoltaic structures.

With preference, for each bypass diode, one of the two electrodes is connected to the corresponding photovoltaic structure by at least one metal interconnector, notably a metal wire or strip.

For each bypass diode, one of the two electrodes may be in direct contact with the rear face of the corresponding photovoltaic structure, notably the photovoltaic cell of the photovoltaic structure or the first photovoltaic cell of the photovoltaic structure. As a variant, the module may comprise a conductive layer that, for each bypass diode, separates one of the two electrodes from the photovoltaic structure, notably a metal layer added to or directly formed on the electrode or an electrically conductive adhesive, notably based on silicone or epoxy. The conductive layer may have a thickness of between 10 and 100 µm, preferentially 20 to 80 µm. With preference, for each bypass diode, one of the two electrodes is in direct or indirect contact with an anode of the corresponding photovoltaic structure.

With preference, for each bypass diode, one of the two electrodes is connected to the corresponding photovoltaic structure by a metal interconnector as described above, and the other one of the two electrodes is in direct or indirect contact, as described above, with the corresponding photovoltaic structure.

With preference, one of the two electrodes of the bypass diode for each photovoltaic structure is an extension of the one of the two electrodes of the bypass diode for a prior or subsequent photovoltaic structure.

At least two of the photovoltaic structures may be electrically connected to one another in series. In this case, the electrode connected to the one of the two photovoltaic structures by a metal interconnector may be an extension of the electrode in direct contact with the other one of the two photovoltaic structures or separated from the other one of the photovoltaic structures by a conductive layer.

At least two of the photovoltaic structures may be electrically connected to one another in parallel. In this case, the electrode connected to the one of the two photovoltaic structures by a metal interconnector may be an extension of the electrode connected to the corresponding other photovoltaic structure by a metal interconnector, or the electrode in direct or indirect contact with one of the two photovoltaic structures may be an extension of the electrode in direct or indirect contact with the other one of the two photovoltaic structures.

Each bypass diode is preferably configured to tolerate a current at least equal to the maximum current likely to pass through the photovoltaic structure that said bypass diode protects. Each bypass diode preferably tolerates a current greater than or equal to 0.5 A.

Each bypass diode is preferably configured to allow the current to flow when the photovoltaic cell or one of the photovoltaic cells of the corresponding photovoltaic structure receives a light intensity less than or equal to 5% of the light intensity received by the other photovoltaic cells.

The multilayer electrical connection structure comprises one blocking diode for a plurality of photovoltaic structures assembled together in series, the blocking diode having two blocking electrodes electrically connected to the terminals of opposite polarity of the first photovoltaic structure and of the last photovoltaic structure, respectively, of the series, and a semiconductor blocking portion in contact with the two blocking electrodes via different surfaces.

"Blocking diode", is understood to mean a diode that enables the flow of current from a series of photovoltaic structures towards a battery or a charge regulator but prevents the flow of current from the battery or the charge regulator towards the series, thus preventing the battery discharging to the photovoltaic structures, notably in the absence of light when the photovoltaic structures are reverse biased.

The module preferably comprises at least one protective structure encapsulating the photovoltaic structures and/or the multilayer electrical connection structure. The protective structure may comprise a polymer encapsulation material, notably a transparent silicone, preferentially with a low degassing rate, for example ethylene-vinyl acetate (EVA) or polyoxyethylene (POE) or any other materials traditionally used as PV module encapsulation. The protective structure may also comprise a cover plate protecting the outer surface of the module from the external environment, notably a plate made of glass or polymer, for example made of polyetheretherketone (PEEK) or a fluorinated film.

The invention also deals with a method for manufacturing a multilayer electrical connection structure which extends over a substrate as described above and is configured to receive photovoltaic structures, said method comprising the deposition of successive layers of the multilayer electrical connection structure on the substrate so as to form a plurality of bypass diodes.

The invention also deals with a method for manufacturing a module as described above, said method comprising the following steps:
  depositing successive layers of the multilayer electrical connection structure on the substrate so as to form a plurality of bypass diodes,
  adding photovoltaic structures to the multilayer electrical connection structure such that the photovoltaic structures are each superposed on one of the bypass diodes,
  electrically connecting, notably by way of metal interconnectors, the photovoltaic structures to one another, notably via the bypass diodes, such that the diodes are in the on state when the corresponding photovoltaic structure is in the off state.

The invention also relates to the use of the module as described above for manufacturing photovoltaic panels, notably intended for use in space or terrestrial use.

With preference, the photovoltaic structures comprise a single photovoltaic cell and the module is used to manufacture photovoltaic panels intended for use in space. The module may be used to manufacture satellite solar generators.

BRIEF DESCRIPTION OF THE DRAWINGS

The invention will be able to be better understood from reading the following detailed description of non-limiting exemplary implementations thereof, and from examining the appended drawing, in which.

DETAILED DESCRIPTION

Figure 1:
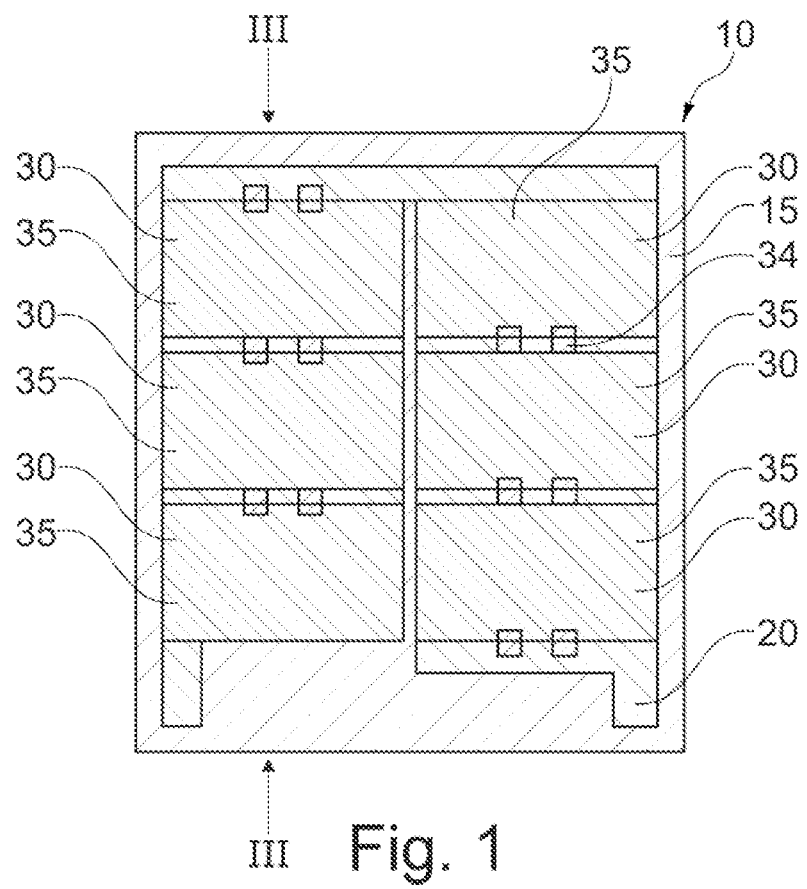
FIG. 1 schematically shows a top view of a photovoltaic module,
  FIG. 2 schematically shows a top view of the multilayer electrical connection structure printed on the substrate of FIG. 1.
Figure 2:
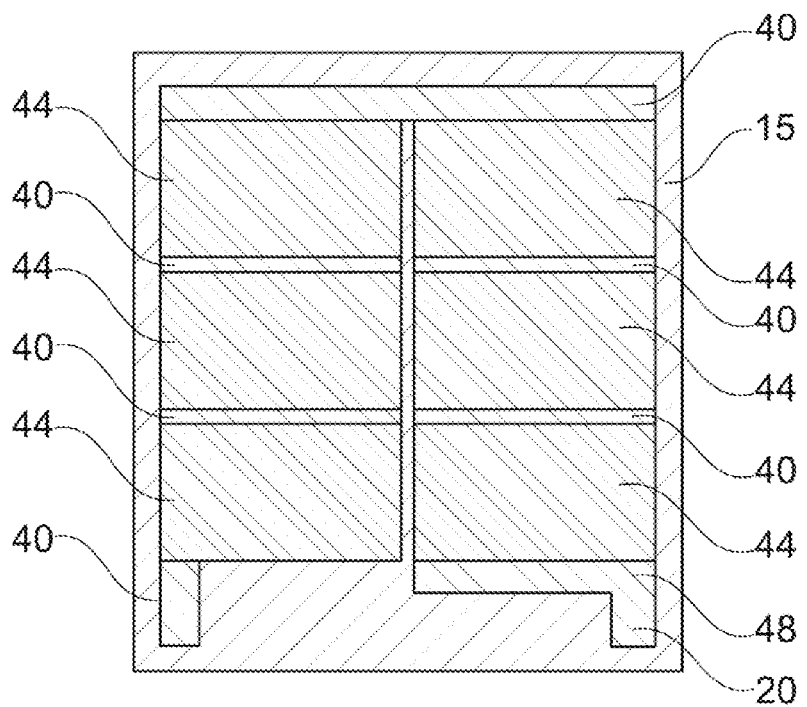
FIG. 2 is a partial section along the line through the photovoltaic module of FIG. 1,
  FIG. 4 schematically shows the electronic circuit of the module when the photovoltaic structures are operating,
  FIG. 5 schematically shows a section through a module variant when one of the photovoltaic structures is reverse biased, FIG. 6 schematically shows a section through a module variant, FIG. 7 schematically shows a section through a module variant, FIG. 8 schematically shows a section through a module variant, and FIG. 9 schematically shows a section through a module variant.
Figure 3:
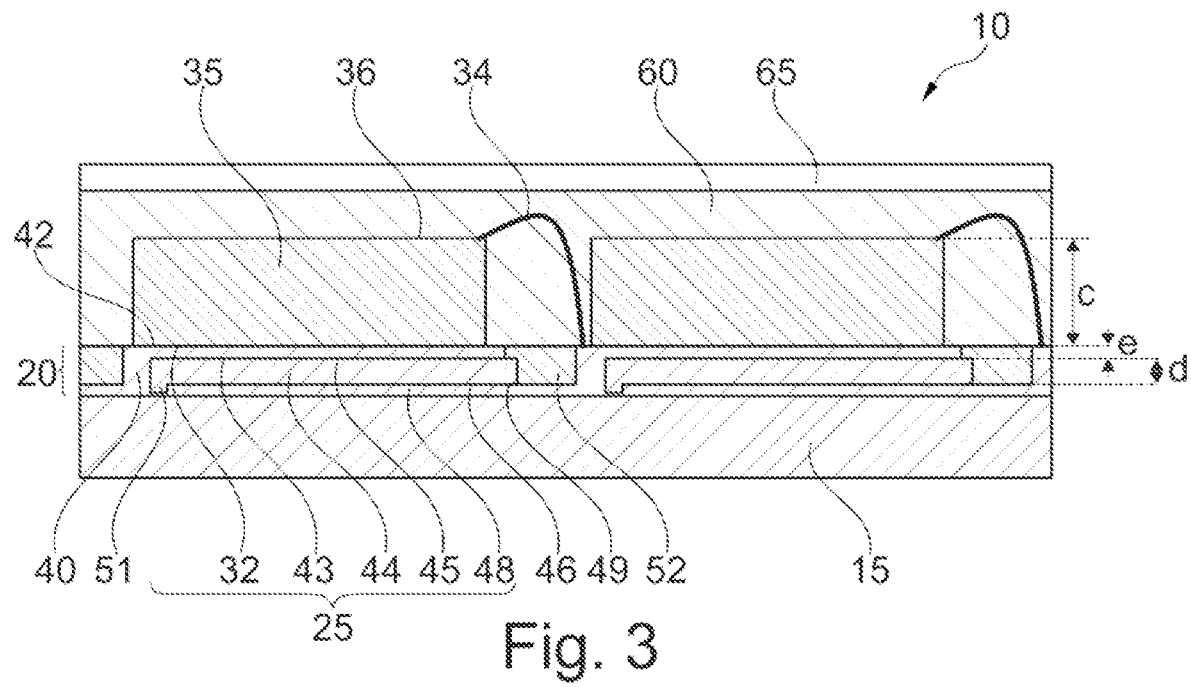

FIGS. 1 to 3 illustrate a photovoltaic module 10 having a flexible or rigid substrate 15 functionalized on one of its flat surfaces by the deposition, notably by printing, of a multilayer electrical connection structure 20, preferably with a constant thickness, on which the photovoltaic structures 30 each formed by a single photovoltaic cell 35 are disposed.

The substrate 15 is made of an electrically insulating polymer material, for example polyimide or PEEK (polyetheretherketone).

As is illustrated in FIG. 3, the multilayer electrical connection structure 20 comprises, for each photovoltaic cell, a bypass diode 25 formed by the stack, between the cell 35 and the substrate 15, of two electrodes 40, 48 separated by a semiconductor portion 44. The electrode 48 is formed by an extension of the electrode 40 of the subsequent photovoltaic cell of the series. The semiconductor portion 44 is preferably in contact with the two electrodes 40 and 48 via its upper surface 45 and lower surface 49, respectively. The electrode 40 extends at least partially between the photovoltaic cell 35 and the substrate 15 and is electrically connected to the photovoltaic structure 30, notably to the anode of the cell, by direct or indirect contact. The contact can be made directly between the upper face 42 of the electrode 40 and the lower face of the cell 32 or indirectly via a conductive layer (not illustrated) extending between the electrode 40 and the photovoltaic structure 30, notably a metal layer added to or directly formed on the electrode 40 or an electrically conductive layer, notably on the basis of silicone or epoxy. The electrode 48 extends between the semiconductor portion 44 and the substrate 15.

The photovoltaic cells 35 are electrically connected to one another in series by electrical connectors 34, notably conductive strips or wires, connecting the upper face of the cells 36, notably the cathode of the cells, to the electrode 40 of the multilayer electrical connection structure 20 associated with the subsequent photovoltaic structure in the series, notably connected to the anode of the subsequent cell. All the photovoltaic cells are preferably identical, but the reverse could be true.

The thickness c of the photovoltaic cells is preferably less than or equal to 150 µm.

The photovoltaic cells may be any type of photovoltaic cell, notably III-V type multi junction cells with semiconductor materials, for example GaInP/GaAs/Ge triple-junction cells.

The semiconductor portion 44 completely separates the two electrodes 40 and 48 from one another by way of an insulator portion 52 such that the current that is to flow from one to the other of the electrodes 40 and 48 can do so only via the semiconductor portion 44 or the photovoltaic cell 35.

The semiconductor layer 44 may have a vertical extension 51 for separating the electrodes 40 and 48 from one another at the substrate 15.

Figure 4:
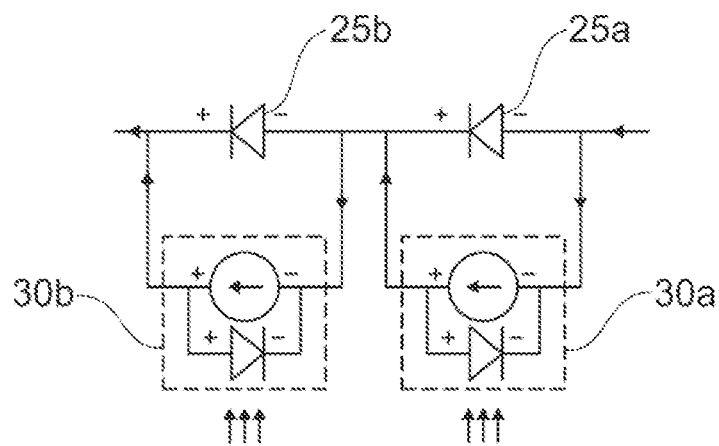
Figure 5:
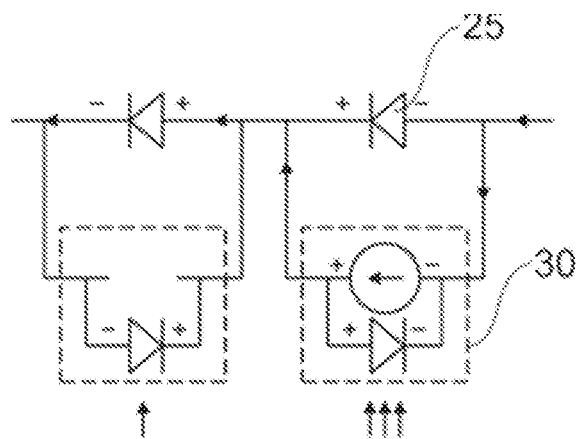

As is illustrated in the circuit diagrams of FIGS. 4 and 5, the semiconductor portions 44 are each oriented so as to be in the off state when the corresponding photovoltaic structure 30 is in the on state, as is illustrated in FIG. 4, in which the two structures 30a and 30b are in the on state, and in the on state when the corresponding photovoltaic structure 30 is reverse biased, as is illustrated in FIG. 5 for the bypass diode 25b when the photovoltaic structure 30b is shaded and therefore reverse biased. The bypass diode is configured to operate with a current at least equal to the maximum current passing through the photovoltaic cell that said bypass diode protects. Each bypass diode preferably tolerates a current greater than or equal to 0.5 A.

The first and second electrodes 40, 48 may be made of a metal, notably aluminium, copper, molybdenum, silver or gold, or a conductive oxide, notably indium tin oxide (ITO) or aluminium-doped zinc oxide (AZO), or an organic semiconductor, notably made of poly(3,4-ethylenedioxythiophene) (PEDOT) or poly(triarylamine) (PTAA).

The first and second electrodes 40 and 48 may each have a thickness e of between 0.1 µm and 100 µm, better still between 0.5 and 10 µm, at the stack forming the bypass diode.

The semiconductor portions 44 may comprise an organic semiconductor or a metal oxide, notably intrinsic zinc oxide (ZnO), titanium oxide (TiO$_2$), zirconium oxide (ZrO$_2$), tin dioxide (SnO$_2$) or else amorphous germanium (a-Ge) or amorphous silicon (a-Si).

The semiconductor portions 44 may have a thickness d of between 0.1 µm and 100 µm, better still between 0.15 µm and 2 µm.

The stacks preferably each extend along a surface area parallel to the plane of the photovoltaic structures 30 that is substantially equal to the surface area of the photovoltaic structure. Such a disposition underneath the photovoltaic structure 30 makes it possible to limit the heating of the bypass diode 25 by facilitating the heat dissipation of the diode 25 during operation.

As illustrated in FIG. 3, the photovoltaic cells 35 and/or the multilayer electrical connection structure 20 may be encapsulated in a protective layer 60 made of polymer, notably EVA or POE, and may superficially comprise a protective plate 65, notably made of glass or PEEK, or a fluorinated film.

Such a photovoltaic module 10 is manufactured by depositing, notably printing, one or more stacked successive layers so as to form the multilayer electrical connection structure 20 on the substrate 15, as described above. The deposition may be done by the following methods:
  contactless printing, such as screen printing or ink jet printing, slot die coating, cathodic sputtering (spray coating) or pulsed laser deposition, and/or
  contact printing, such as gravure printing, and/or
  layer deposition, notably chemical vapour deposition (CVD), plasma-enhanced chemical vapour deposition (PECVD), or atomic layer deposition (ALD).

Once the multilayer electrical connection structure 20 has been produced, the photovoltaic cells 35 are added in register to the bypass diodes 25 of the multilayer electrical connection structure 20 in direct contact with the corresponding superficial electrode 40 or separated from said electrode by a conductive layer as described above. The upper surfaces of the cells 30 are electrically connected by connectors 34 to the superficial electrode 40 extending underneath the cell downstream of the series. The protective layer 60 is then added, as is the protective plate.

Figure 6:
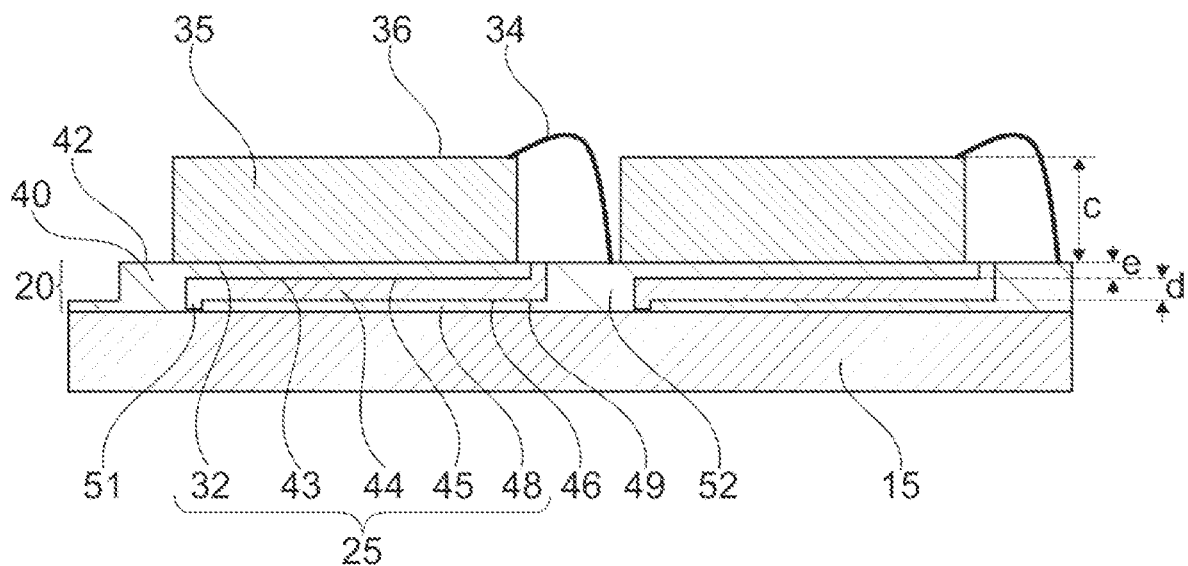
Figure 7:
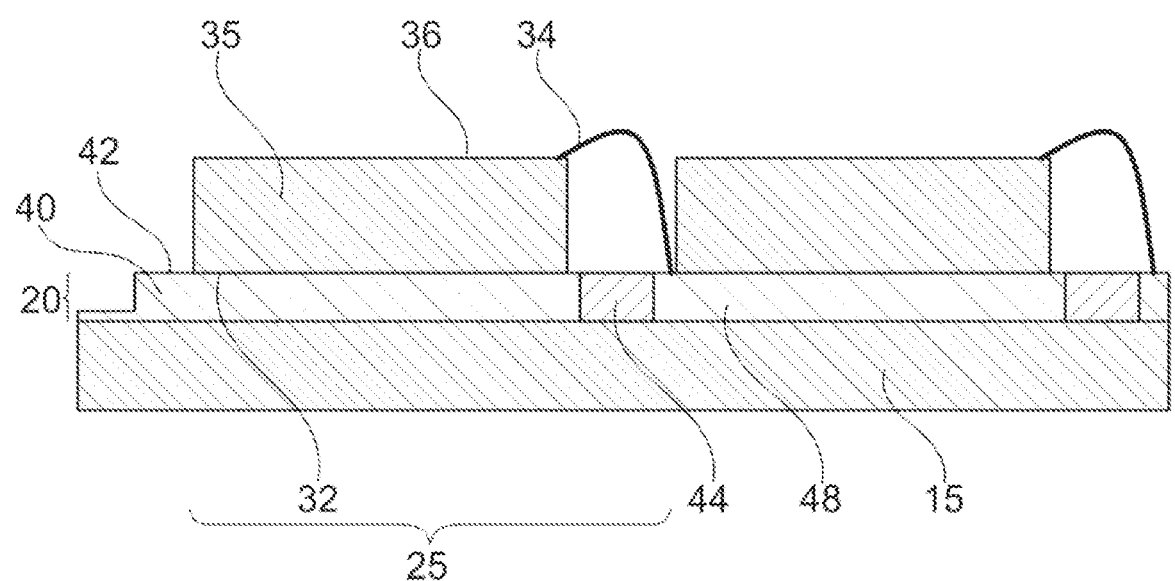

The examples of FIGS. 6 and 7 differ from that of FIG. 3 in terms of the arrangement of the various elements of the multilayer electrical connection structure 20.

In the example of FIG. 6, the multilayer electrical connection structure 20 does not comprise an insulator portion between the various electrodes of said structure 20. The various electrodes are separated from one another solely by the semiconductor layer 44, the latter having two vertical extensions 51 separating the two electrodes 40 and 48 at the substrate 15 and at the upper surface of the multilayer electrical connection structure 20, respectively.

In the example of FIG. 7, the multilayer electrical connection structure 20 does not comprise an insulator portion between the various electrodes of said multilayer electrical connection structure 20 and the bypass diode 25 is not formed by a stack but by a juxtaposition of electrodes underneath the cells and semiconductor portions between the cells.

Figure 8:
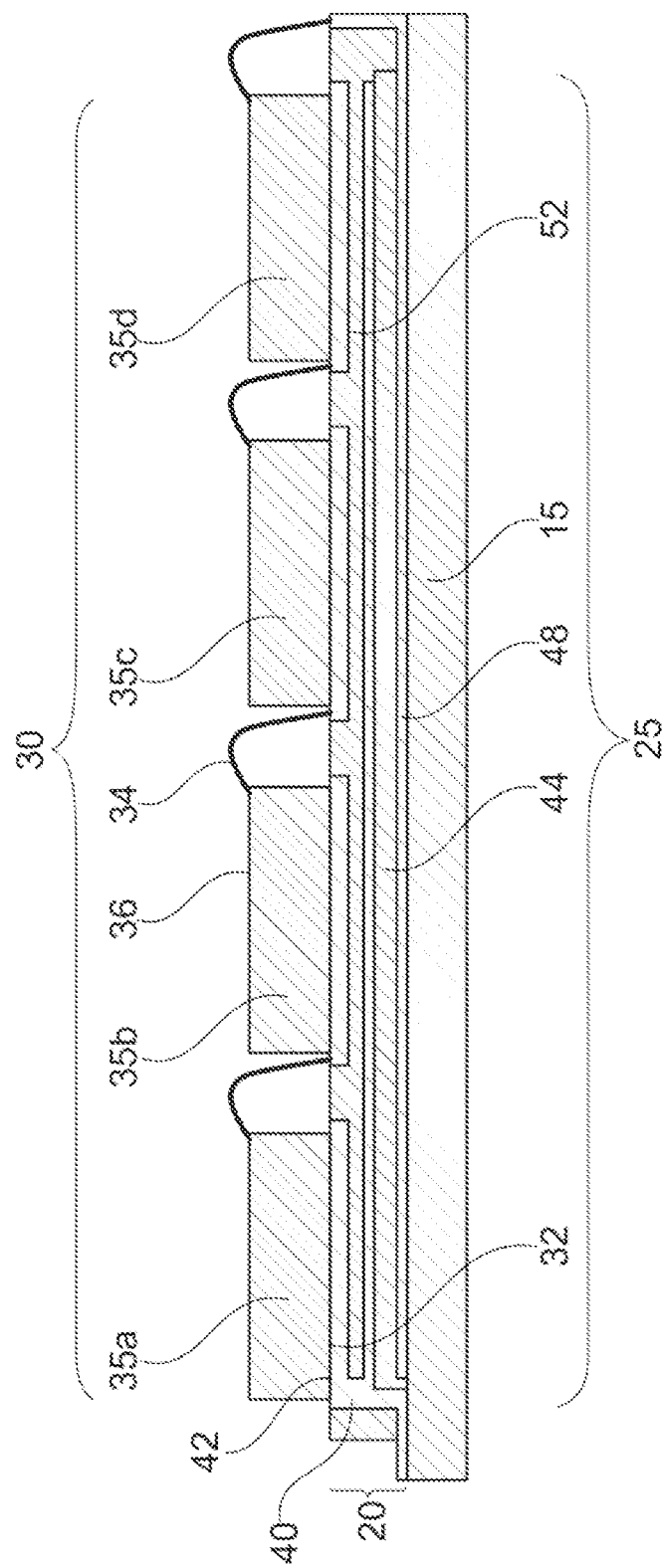

The example of FIG. 8 differs from that of FIG. 3 in that the bypass diode 25 makes it possible to protect a photovoltaic structure 30 having a plurality of photovoltaic cells 35a to 35d assembled in series with respect to one another. The electrode 40 of the superficial diode 25 of the multilayer electrical connection structure 20 is electrically connected to the first cell 35a of the series and the electrode 48 is electrically connected to the last cell 35d of the series via an electrical conductor 34. The semiconductor portion 44 extends between the two electrodes 40 and 48 underneath the entire surface of the photovoltaic structure 30. The electrodes of the intermediate cells 35b and 35c are insulated from the electrodes 40 and 48 by one or more insulator portions 52.

Figure 9:
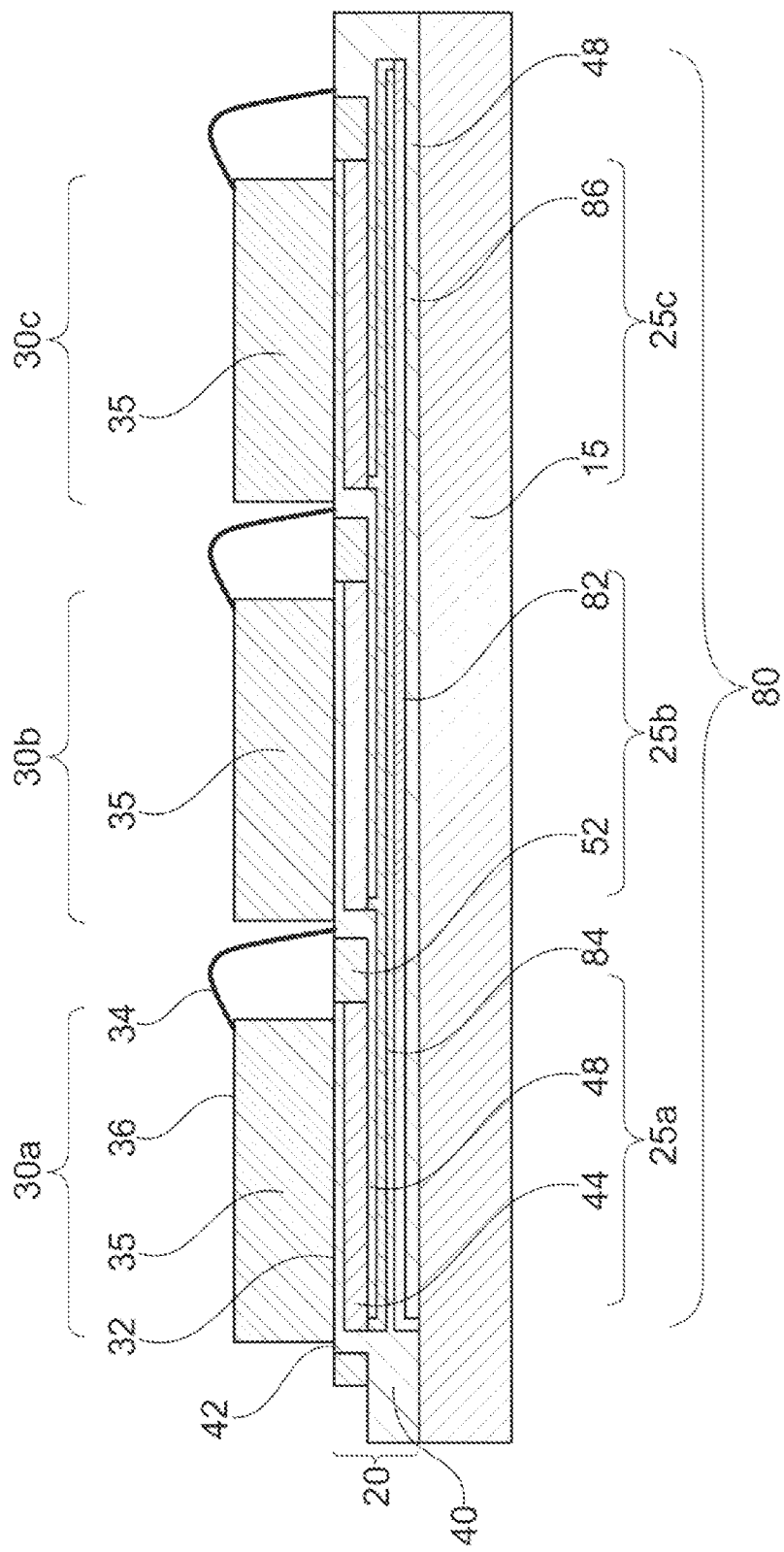

The example of FIG. 9 differs from that of FIG. 3 in that, in addition to the bypass diodes for each photovoltaic structure 30a, 30b and 30c of the module, in the multilayer electrical connection structure 20 underneath the bypass diodes 25a, 25b and 25c, it comprises a blocking diode 80 for turning off the photovoltaic structures 30a, 30b and 30c connected to one another in series. The blocking diode 80 comprises a semiconductor blocking layer 82 extending between two electrodes 84 and 86. One of the electrodes 82 is an extension of the superficial electrode 40 of the multilayer electrical connection structure 20 underneath the first photovoltaic structure 30a of the series and the other electrode 84 is electrically connected to the last structure 30c of the series via an electrical conductor 34.

The invention is not limited to the examples that have just been described. The various elements of the embodiments described above may be combined, provided that they are compatible.

For example, the module may comprise different photovoltaic structures, notably having a different number of cells.

The module may comprise a blocking diode in addition to the bypass diode protecting the photovoltaic structures of multiple cells.

The semiconductor portion may have any other shape as long as it separates the two electrodes and is connected to them in reverse in relation to the photovoltaic structure.

The multilayer electrical connection structure may comprise additional functions, notably temperature or voltage sensors.

It is possible for not all of the cells to be connected in series; they may also be connected to one another in bypass.

The invention claimed is:

1. A photovoltaic module, having:
   a substrate,
   a plurality of photovoltaic structures that are electrically connected to one another and extend over the substrate, each of which comprises at least one photovoltaic cell, and
   a multilayer electrical connection structure sandwiched between the substrate and the plurality of photovoltaic structures, forming at least one bypass diode for each photovoltaic structure,
   each bypass diode having:
   two electrodes electrically connected to the terminals of opposite polarity of the corresponding photovoltaic structure, at least one of the two electrodes extending at least partially underneath the corresponding photovoltaic structure, and
   a semiconductor portion in contact with the two electrodes via two separate surfaces,
   wherein the semiconductor portion of each bypass diode is sandwiched between the two electrodes of the corresponding bypass diode so as to form a stack, each stack extending along a surface area parallel to the plane of the photovoltaic structures that is greater than or equal to 50% of the surface area of the photovoltaic structure,
   wherein one of the electrodes of each bypass diode is one of the electrodes of the bypass diode for a prior or subsequent photovoltaic structure.

2. The photovoltaic module according to claim 1, wherein at least one photovoltaic structure comprises a single photovoltaic cell.

3. The photovoltaic module according to claim 1, wherein at least one photovoltaic structure comprises an assembly of multiple photovoltaic cells in series, the one of the two electrodes of the corresponding bypass diode being electrically connected to the first photovoltaic cell of the assembly in series, the other one of the two electrodes of the corresponding bypass diode being electrically connected to at least the last photovoltaic cell of the assembly in series.

4. The photovoltaic module according to claim 1, wherein the semiconductor portion of each bypass diode is in contact with one of the electrodes via a first surface substantially parallel to a plane of extent of the photovoltaic structures, and in contact with the other one of the electrodes via a second surface opposite to the first.

5. The photovoltaic module according to claim 1, wherein the two electrodes of each bypass diode are separated from one another solely by the semiconductor portion of the corresponding bypass diode, or the bypass diodes each comprise at least one insulating portion designed to separate the two electrodes from one another by way of the semiconductor portion.

6. The photovoltaic module according to claim 1, wherein, for each bypass diode, one of the two electrodes is connected to the corresponding photovoltaic structure by at least one metal interconnector, notably a metal wire or strip.

7. The photovoltaic module according to claim 1, wherein, for each bypass diode, one of the two electrodes is in direct contact with the rear face of the corresponding photovoltaic structure, or the module comprises a conductive layer that, for each bypass diode, separates one of the two electrodes from the photovoltaic structure.

8. The photovoltaic module according to claim 1, wherein one of the two electrodes of the bypass diode for each photovoltaic structure is an extension of the one of the two electrodes of the bypass diode for a prior or subsequent photovoltaic structure.

9. The photovoltaic module according to claim 1, wherein at least two photovoltaic structures are directly connected to one another in series.

10. The photovoltaic module according to claim 1, wherein at least two photovoltaic structures are directly connected to one another in parallel.

11. The photovoltaic module according to claim 1, wherein the multilayer electrical connection structure comprises one blocking diode for a plurality of photovoltaic structures assembled together in series, the blocking diode having two blocking electrodes electrically connected to the terminals of opposite polarity of the first photovoltaic structure and of the last photovoltaic structure, respectively, of the series, and a semiconductor blocking portion in contact with the two blocking electrodes via different surfaces.

12. A method for manufacturing a photovoltaic module for manufacturing a module according to claim 1, the method comprising the following steps:
- depositing successive layers of the multilayer electrical connection structure on the substrate so as to form a plurality of bypass diodes,
- adding photovoltaic structures to the multilayer electrical connection structure such that the photovoltaic structures are each superposed on one of the bypass diodes,
- electrically connecting the photovoltaic structures to one another such that the bypass diodes are in the on state when the corresponding photovoltaic structure is in the off state.

13. The photovoltaic module according to claim 12, wherein the multilayer electrical connection structure is printed or otherwise deposited on the substrate.

14. A photovoltaic panel comprising the photovoltaic module according to claim 1.

15. The photovoltaic module according to claim 1, wherein one of the electrodes of each photovoltaic structure is a continuous layer of a conductive material that extends both underneath the corresponding photovoltaic structure and underneath a prior or subsequent photovoltaic structure of the plurality of photovoltaic structures.

16. The photovoltaic module according to claim 1, wherein the multilayer electrical connection structure has a substantially uniform thickness over the substrate.

17. The photovoltaic module according to claim 1, wherein the multilayer electrical connection structure is constituted of a plurality of deposited layers of material, each electrode being constituted of one deposited layer of a conductive material or a plurality of deposited layers of a conductive material forming a continuous multilayer electrode and the semiconductor portion being constituted of at least one deposited layer of a semiconductor material.

* * * * *